(12) United States Patent
Chen et al.

(10) Patent No.: US 7,391,116 B2
(45) Date of Patent: Jun. 24, 2008

(54) FRETTING AND WHISKER RESISTANT COATING SYSTEM AND METHOD

(75) Inventors: Szuchain F. Chen, Hamden, CT (US); Nicole A. Lasiuk, Spring, TX (US); John E. Gerfen, St.Charles, MO (US); Peter W. Robinson, Glen Carbon, IL (US); Abid A. Khan, Ellisville, MO (US)

(73) Assignee: GBC Metals, LLC, East Alton, IL (US)

( * ) Notice: Subject to any disclaimer, the term of this patent is extended or adjusted under 35 U.S.C. 154(b) by 247 days.

(21) Appl. No.: 10/962,917

(22) Filed: Oct. 12, 2004

(65) Prior Publication Data

US 2005/0106408 A1 May 19, 2005

Related U.S. Application Data

(60) Provisional application No. 60/511,249, filed on Oct. 14, 2003.

(51) Int. Cl.
*H01L 23/48* (2006.01)
*H01L 23/52* (2006.01)
*H01L 29/40* (2006.01)

(52) U.S. Cl. .................. 257/762; 257/635; 257/700; 257/748; 257/758

(58) Field of Classification Search ................ 257/309, 257/296, 303, 306, 310, 635, 700, 748, 762, 257/758–759, E23.054, E23.062, E23.173, 257/E23.155, E23.161, E21.021, E21.295
See application file for complete search history.

(56) References Cited

U.S. PATENT DOCUMENTS

| | | | |
|---|---|---|---|
| 1,904,241 A | 4/1933 | Kammerer | |
| 2,239,771 A | 4/1941 | Becker | |
| 2,294,482 A | 9/1942 | Siegmund | |
| 2,417,967 A | 3/1947 | Booe | |
| 3,314,771 A | 4/1967 | Hoffmann et al. | |
| 3,641,300 A | 2/1972 | Nitz | |
| 3,650,825 A | 3/1972 | Lihl | |
| 3,686,746 A | 8/1972 | Gwyn, Jr. | |
| 4,339,644 A | 7/1982 | Aldinger et al. | |
| 4,756,467 A | 7/1988 | Schatzberg | |
| 4,883,774 A | 11/1989 | Djennas et al. | |
| 5,075,176 A | 12/1991 | Brinkmann | |
| 5,393,573 A | 2/1995 | MacKay | |
| 5,422,451 A | 6/1995 | Herklotz | |
| 5,510,197 A | 4/1996 | Takahashi et al. | |
| 5,780,172 A | 7/1998 | Fister et al. | |
| 5,808,853 A | 9/1998 | Dalal et al. | |
| 5,916,695 A | 6/1999 | Fister et al. | |
| 5,981,090 A | 11/1999 | Ott | |
| 6,013,572 A | 1/2000 | Hur et al. | |
| 6,110,608 A | 8/2000 | Tanimoto et al. | |
| 6,203,931 B1 | 3/2001 | Chu et al. | |
| 6,451,449 B2 | 9/2002 | Asakura et al. | |
| 6,596,621 B1 | 7/2003 | Copeland et al. | |
| 6,603,205 B2 | 8/2003 | Miura | |
| 6,638,643 B2 | 10/2003 | Schleicher et al. | |
| 6,641,930 B2 | 11/2003 | Schleicher et al. | |
| 6,727,587 B2 | 4/2004 | Riedl | |
| 6,822,283 B2 * | 11/2004 | Lin et al. ..................... | 257/309 |
| 2002/0185716 A1 | 12/2002 | Abys et al. | |
| 2003/0113577 A1 | 6/2003 | Zheng | |
| 2003/0186597 A1 | 10/2003 | Suzuki et al. | |
| 2004/0038072 A1 | 2/2004 | Miura | |

FOREIGN PATENT DOCUMENTS

| | | |
|---|---|---|
| DE | 2207012 | 8/1973 |
| DE | 3712691 | 6/1988 |
| DE | 3932535 | 7/1990 |
| JP | 54-072483 | 6/1979 |
| JP | 01-283780 | 11/1989 |
| JP | 01-306574 | 12/1989 |
| JP | 02-301573 | 12/1990 |
| JP | 04-10699 | 3/1992 |
| JP | 08-055521 | 2/1996 |
| JP | 11-193494 | 7/1999 |
| JP | 11-229178 | 8/1999 |
| JP | 11-343594 | 12/1999 |
| JP | 11-350188 | 12/1999 |
| JP | 11-350189 | 12/1999 |
| JP | 11-350190 | 12/1999 |

| | | |
|---|---|---|
| JP | 2000-054189 | 2/2000 |
| JP | 2001-053210 | 2/2001 |
| JP | 2001-131774 | 5/2001 |
| JP | 2003-013279 | 1/2003 |
| JP | 2003-328157 | 11/2003 |
| JP | 2004-022306 | 1/2004 |
| WO | 97/22472 | 6/1997 |

OTHER PUBLICATIONS

CRC Handbook of Chemistry and Physics, 70th Ed., R.C. Weast, Ph.D., editor, (1989-1990).

McDowell, M.E., *Tin Whiskers, A Case Study*, Aerospace Applications Conference, pp. 207-215 (1993).

*DOE3 Test Results Update 60C/93RH Storage, 6000 HRS Inspection*, DOE3 Test Results Update, Peter Bush, SUNY at Buffalo, Aug. 2004.

*Interim Recommendations of Lead-Free Finishes for Components Used in High-Reliability Products*, NEMI Tin Whisker User Group, Mar. 2004.

NEMI Tin Whisker Modeling Project, Interim Report, Jul. 21, 2003.

Osenbach, J.W. et al., *The Effects of Board Attachment Processing on Sn Whisker Processing on Sn Whisker Formation on Electroplated Matte-Sn on Cu Alloy Lead Frames*, Agere Systems, Allentown, PA and Bangkok, Thailand.

\* cited by examiner

*Primary Examiner*—Zandra V. Smith
*Assistant Examiner*—Thanh Y. Tran
(74) *Attorney, Agent, or Firm*—Harness, Dickey & Pierce, P.L.C.

(57) ABSTRACT

A coated electrically conductive substrate has particular utility where there are multiple closely spaced leads and tin whiskers constitute a potential short circuit. This electrically conductive substrate has a plurality of leads separated by a distance capable of bridging by a tin whisker, a silver or silver-base alloy layer coating at least one surface of at least one of the plurality of leads, and a fine grain tin or tin-base alloy layer directly coating said silver layer. An alternative coated electrically conductive substrate has utility where debris from fretting wear may increase electrical resistivity. This electrically conductive substrate has a barrier layer deposited on the substrate that is effective to inhibit diffusion of the substrate into a subsequently deposited layers, which include a sacrificial layer deposited on the barrier layer that is effective to form intermetallic compounds with tin, and a low resistivity oxide metal layer deposited on the sacrificial layer.

An alternative coated electrically conductive substrate has particular utility where debris from fretting wear may oxidize and increase electrical resistivity, such an in a connector assembly. This electrically conductive substrate has a barrier layer deposited on the substrate that is effective to inhibit diffusion of constituents the substrate into a plurality of subsequently deposited layers. The subsequently deposited layers include a sacrificial layer deposited on the barrier layer that is effective to form intermetallic compounds with tin, a low resistivity oxide metal layer deposited on said sacrificial layer, and an outermost layer of tin or a tin-base alloy directly deposited on the low resistivity oxide metal layer.

In this alternative embodiment, the barrier layer is preferably nickel or a nickel-base alloy and the low resistivity oxide metal layer is preferably silver or a silver-base alloy.

When heated, the coated substrate of this second embodiment forms a unique structure having a copper or copper-base alloy substrate, an intervening layer formed from a mixture or metals including copper and tin, and an outermost layer which is a mixture of a copper-tin intermetallic containing phase and a silver-rich phase. It is believed that this silver-rich phase is particularly beneficial to reduce an increase in resistivity due to oxidation of fretting wear debris.

2 Claims, 7 Drawing Sheets

Fig 11 ated PATENT
FRETTING AND WHISKER RESISTANT COATING SYSTEM AND METHOD

CROSS-REFERENCE TO RELATED PATENT APPLICATIONS

This patent application claims priority to U.S. Provisional Patent Application Ser. No. 60/511,249 that was filed on Oct. 14, 2003. The subject matter of that provisional patent application is incorporated by reference in its entirety herein.

BACKGROUND OF THE INVENTION (1) Field of the Invention

This invention relates to systems and methods for coating electrically conductive substrates, and more particularly to multi-layer systems and methods for coating electrically conductive substrates.

(2) Description of the Related Art

Throughout this patent application, the word "base" to qualify an alloy means that the alloy contains at least 50%, by weight, of the qualified element, for example, "copper-base" means more than 50%, by weight, of copper. Copper and copper-base alloys (hereinafter generally referred to as "copper") are commonly used in electrical and electronic industries for connectors, electrical harnesses, printed circuit boards, ball grid arrays, leadframes, multichip modules, and the like. While copper provides excellent electrical conductivity, it is known to easily oxidize and tarnish when exposed to elevated temperatures, moisture, or chemicals. Oxidation and tarnishing of copper generally result in high electrical contact resistance, thereby reducing performance of electrical devices. In addition, oxidation and tarnishing of copper reduce the wettability of solder, and generally makes soldering problematic.

One method to reduce oxidation and tarnishing of copper is to apply a tin or tin-base alloy coating (hereinafter generally referred to as "tin") onto a copper substrate. The tin coating acts as a barrier to prevent or reduce oxidation, and thereby maintain the electrical performance of the substrate. However, there are many problems associated with using tin as a coating layer on a conductive substrate. Rapidly at elevated temperatures, and more gradually at room temperature (nominally 25° C.), the tin coating interdiffuses with the copper substrate to form copper-tin intermetallic compounds (IMC's). These IMC's reduce the thickness of the tin coating layer and cause an increase in contact resistance and degradation of solderability.

Exemplary thermal excursions include 250° C. for a few seconds during wire bonding or encapsulation in a polymer, 300° C. for a few seconds during reflow and 150° C. for from 8 to 168 hours for a controlled reduction of tin thickness to reduce friction.

One approach taken to reduce the effect of IMC formation and maintain a low contact resistance is to use a thicker tin coating; however, this approach not only increases the cost of the parts but also causes some functional problems. Where the tin coating is used on an electrical connector, a thicker coating of soft tin increases friction leading to an increased insertion force, making plugging and unplugging the connector physically difficult. For electronic devices, a thicker tin or tin alloy coating is also undesirable since the trend is to make electronic devices thinner and smaller. Moreover, where the tin coating is used on leads of an electronic device, a thick tin coating can cause problems in the coplanarity and fine line definition of the leads.

Another approach taken to reduce the effect of IMC formation is to use a transition barrier layer between the copper substrate and the tin coating to inhibit the growth of IMC. For example, U.S. Pat. No. 4,441,118 reports low IMC growth rates using a copper-nickel alloy substrate with 15-30% nickel.

In another example, a publication by P. J. Kay and C. A. Mackay, in *Transactions of the Institute of Metal Finishing*, Volume 51, 1979, at page 169, discusses the use of various metals as transition barrier layers. In one example, this publication describes a silver barrier layer having a thickness of 1 micrometer. However, this example was shown to be undesirable because the silver transition barrier layer resulted in no substantial reduction in the diffusion rate between copper and tin. U.S. Pat. No. 4,756,467 to Schatzberg discloses a solderable connector having a copper substrate, a thin layer of silver, a silver-tin alloy layer and an outermost tin layer. The silver-tin alloy layer is formed by a diffusion anneal. Japanese Patent Number 2670348 (publication number 02-301573) to Furukawa Electric Co. Ltd. discloses a copper substrate coated with a barrier layer that is nickel or cobalt, followed by silver layer followed by a melt-solidified layer of tin or tin alloy.

Commonly owned U.S. patent application Ser. No. 10/930,316, that was filed on Aug. 31, 2004 as a continuation of U.S. patent application Ser. No. 09/657,794 discloses a thin anti-tarnish layer disposed between a copper substrate and a tin coating layer. Among the metals disclosed as anti-tarnish layers are zinc, chromium, indium, phosphorous, manganese, boron, thallium, calcium, silver, gold, platinum, palladium and combinations and alloys thereof.

Other barrier layers are disclosed in commonly owned U.S. Pat. No. 5,780,172, to Fister et al., and commonly owned U.S. Pat. No. 5,916,695 to Fister et al. U.S. Pat. Nos. 4,756,467 and 5,916,695 as well as U.S. patent application Ser. No. 10/930,316 are incorporated by reference in their entireties herein.

Another problem associated with the use of tin as a coating layer for a conductive substrate is that tin is susceptible to fretting corrosion. Fretting corrosion is the oxidation of contact surfaces that results from relative motion (fretting) between two mating contact surfaces. The oxidation caused by fretting can result in an unacceptable increase in contact resistance. Certain metals, such as silver, are known to have excellent resistance to fretting corrosion. However, silver tends to tarnish in the atmosphere due to the presence of sulfur dioxide, which causes silver sulfide to form on the surface of the silver. The tarnish is aesthetically unacceptable and could degrade the functional properties of the electrical contact.

Yet another problem associated with the use of a tin coating layer, as well as other coating layers such as zinc, indium, antimony, or cadmium, on a conductive substrate is that tin is susceptible to whiskering. Whiskering occurs as the tin ages and stresses in the tin or at the tin/IMC interface begin to build. Whiskering also occurs due to internal stress resulting from the plating process. To relax the stress, single crystals of tin nucleate from the surfaces like whiskers. Each whisker continues to grow until the internal stresses subside. Whiskering can cause many different problems, including shorting of adjacent electrical contact surfaces. Alloying the tin coating with a small amount of lead (Pb) is a common means of reducing whisker growth. However, because of health and environmental reasons, many industries are striving to reduce or eliminate the use of lead.

Thus, there is a need to develop a coating system that would be able to maintain a low contact resistance and good solderability after fretting and thermal exposure, combined with one or all of the additional attributes of lower coefficient of friction, and reduced whisker growth.

BRIEF SUMMARY OF THE INVENTION

In accordance with a first embodiment of the invention, there is provided a coated electrically conductive substrate having particular utility where there are multiple closely spaced features and a tin whisker constitutes a potential short circuit. Such substrates include leadframes, terminal pins and circuit traces such as on printed circuit boards and flexible circuits and the features include leads, lines and circuit traces. The electrically conductive substrate has a plurality of leads separated by a distance capable of bridging by a tin whisker, a silver or silver-base alloy layer coating at least one surface of at least one of the plurality of leads, and a fine grain tin or tin-base alloy layer directly coating said silver layer.

In accordance with a second embodiment of the invention, there is provided a coated electrically conductive substrate having particular utility where the debris from fretting wear may oxidize and increase electrical resistivity, such as in a connector assembly. The electrically conductive substrate has a barrier layer deposited on the substrate that is effective to inhibit diffusion of constituents of the substrate into a plurality of subsequently deposited layers. The subsequently deposited layers include a sacrificial layer deposited on the barrier layer that is effective to from intermetallic compounds with tin, a metal that is capable of forming a low resistivity oxide (referred to herein as a "low resistivity oxide metal layer") deposited on said sacrificial layer, and an outermost layer of tin or a tin-base alloy directly deposited on the low resistivity oxide metal layer In this second embodiment, the barrier layer is preferably nickel or a nickel-base alloy and the low resisitivity oxide metal layer is preferably silver or a silver-base alloy.

When heated, the coated substrate of this second embodiment forms a unique structure having a copper or copper-base alloy substrate, an intervening layer formed from a mixture or metals including copper and tin, and an outermost layer which is a mixture of a copper-tin intermetallic containing phase and a silver-rich phase.

It is believed that this silver-rich phase is particularly beneficial to minimize an increase in resistivity due to oxidation of fretting wear debris.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which.

DETAILED DESCRIPTION

Figure 1:
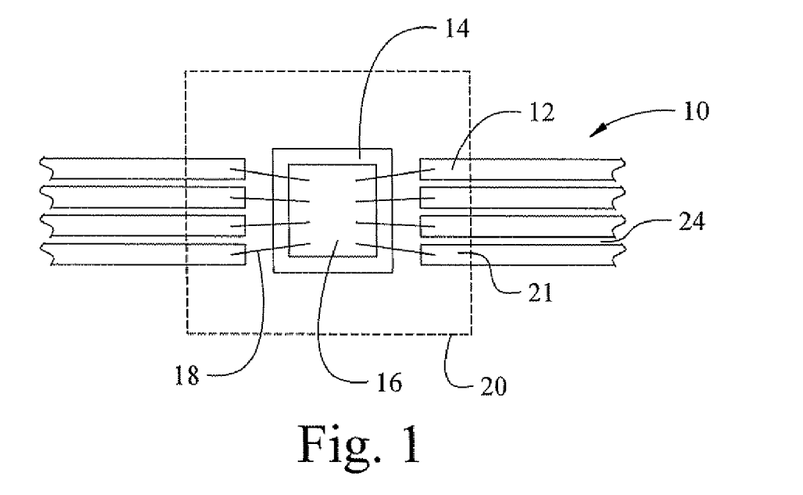
FIG. 1 is a top planar view of a leadframe prior to encapsulation and coating in accordance with a first embodiment of the invention.

Referring to FIG. 1, a leadframe has a plurality of leads 10 are formed from an electrically conductive metal, such as copper or a copper-base alloy. Each of the plurality of leads 10 terminates at an inner lead end 12 to define a central aperture that is occupied by a die paddle 14. Typically, the inner lead ends 12 and die paddle 14 are coated with a thin layer of a precious metal, such as silver, to enhance chip attach and wire bonding. When silver, this thin layer has a typical thickness of between 3 microns and 6 microns and is deposited by electrodepostion. One or more integrated circuit (IC) devices 16, commonly referred to as semiconductor chips, are then attached to the die paddle 14, such as through the use of a low temperature metallic solder or a thermally conductive polymer adhesive. Thin metal wires 18, or thin strips of conductive metal foil, electrically interconnect circuits on an electrically active face of the integrated circuit device 16 to the inner lead ends 12. A molding resin then encapsulates the die paddle 14, integrated circuit device 16, inner lead ends 12 and lead mid-portions 21, generally along the perimeter identified by the broken line 20.

Figure 2:
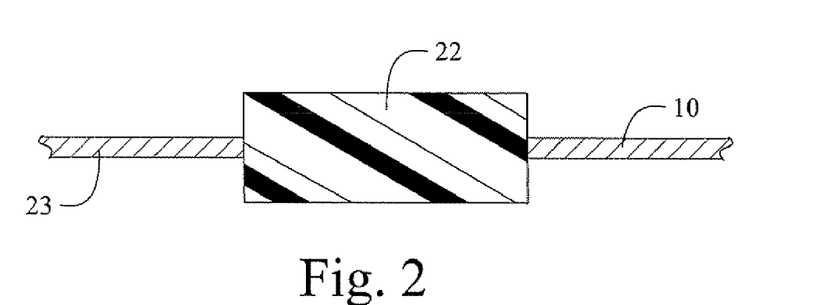
FIG. 2 is side planar view of the leadframe of FIG. 1 subsequent to encapsulation but prior to coating in accordance with the first embodiment of the invention.

FIG. 2 is a side planar view of the assembly showing leads 10 extending from the molding resin 22. Outer portions 23 of the leads extending from the molding resin are typically soldered to external circuitry, such as traces on a printed circuit board. To maximize electrical conductivity, the leads are typically formed from copper or a copper alloy, although non-copper leads such as iron-nickel and iron-nickel-cobalt alloys are used. Copper and copper alloys readily oxidize and the formation of an oxide on the surface impedes soldering.

To inhibit oxide formation, it is common to deposit a tarnish resistant layer on the copper leads. One readily solderable material for the anti-tarnish layer is tin or a tin-base alloy. When exposed to temperatures at or above room temperature, there is diffusion between the copper and the tin. As a copper-tin intermetallic forms on the surface of the layer, the anti-tarnish characteristics and solderability both degrade. It is known to dispose a barrier layer, such as nickel, between the anti-tarnish layer and the substrate to reduce the rate of diffusion and reduce the rate of intermetallic formation.

Tin whiskering refers to a characteristic of tin where internal stresses are relieved by the growth of thin tin filaments. Referring back to FIG. 1, the leads 10 are closely spaced and it is possible for a tin whisker to bridge the gap 24 between adjacent leads creating an electrical short circuit. Typically, a gap distance between leads of 1 millimeter or less is at risk of being bridged by a tin whisker. While numerous solutions for preventing tin whiskering have been proposed, these solutions have limitations. It is known reduce whiskering by alloying the tin with another metal, such as lead, but lead is toxic. It is known to heat the tin to above its melting temperature, a process known as reflow, to reduce whiskering. It is difficult to control the flow of molten tin and bridging between leads frequently results during reflow.

Figure 3:
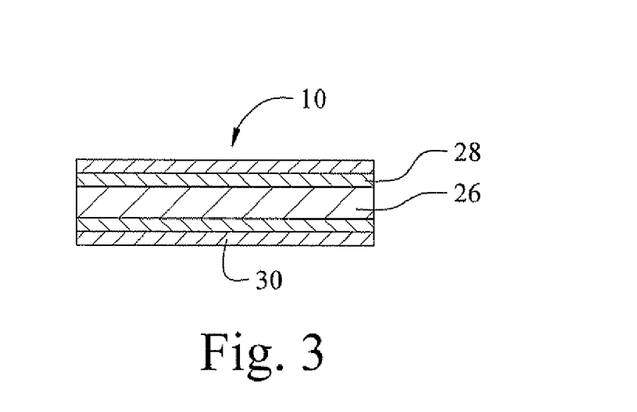
FIG. 3 is a cross-sectional view of the leadframe of FIG. 1 subsequent to encapsulation and coating in accordance with the first embodiment of the invention.

In accordance with a first embodiment of the invention and referring to FIG. 3, tin whiskering is reduced by forming the lead 10 from a substrate 26 that is coated with a layer of silver or a silver-base alloy 28, followed by a layer of fine grain tin 30 directly deposited on the layer of silver or silver-base alloy. By "directly" deposited, it is meant deposited to be adjoining, without any intervening layers of other materials. If the substrate 26 is formed from a metal other than copper or a copper base alloy, a thin, on the order of 1-20 microinches layer of copper may be deposited on the substrate prior to deposition of the layer of silver 28. The layer of silver 28 may be a silver-base alloy and the layer of tin may be a tin-base alloy.

The interface between two metals tends to have less strength than the metal itself. Therefore, it is preferred that the portion of the leads 10 encapsulated by molding resin are not coated with the layers of silver and tin and these layers coat only those portions of the leads which extend outward from the molding resin. The layer of silver 28 has a thickness of between 1 microinch and 120 microinches. When the thickness is below 1 microinch, tin whiskering is not adequately suppressed. When the thickness is about 120 microinches, the cost becomes prohibitive. A preferred silver thickness is from 2 microinches to 40 microinches and a most preferred silver thickness is from 5 microinches to 20 microinches.

The layer of tin 30 has a thickness of between 0.01 microinch and 400 microinches. When the tin thickness is less than 0.01 microinch, tarnish resistance and solderability are degraded. When the tin thickness exceeds 400 microinches, bridging between adjacent leads is likely. A preferred tin thickness is from 20 microinches to 150 microinches and a most preferred tin thickness is from 20 microinches to 80 microinches.

The tin is fine grain, as achieved by electrodeposition, as opposed to coarser grain as achieved following reflow. Typically, the average grain size is from 0.1 micron to 100 microns, and preferably from 0.5 micron to 5 microns, as opposed to after reflow when the nominal grain size is on the order of millimeters. The fine grain structure has a generally higher ductility enabling the leads to be bent to a sharper radius without fracture of the coating layer. While a fine grain tin is believed more prone to whisker formation, the underlayer of silver enables use of fine grain tin in this embodiment.

While this first embodiment has been described in view of a leadframe having closely spaced leads, other structures such as terminal pins, printed circuit boards and flex circuits having other closely spaced features such as lines and circuit traces also benefit from the whisker-free coatings of the invention.

A second embodiment of the invention is drawn to connector assemblies. Unlike leadframes, most connector assemblies are not affected by tin whiskers since adjacent connectors are usually spaced apart far enough to avoid short circuiting by tin whiskers. Also, since connectors are not closely pitched like leads of a leadframe, reflow is available to reduce internal stresses in a tin coating. Further, diffusion between tin and copper is frequently desirable to reduce the thickness of free tin, thereby reducing friction and reducing the force needed to insert a probe into a socket.

Connector assemblies are subject to an increase in resistivity due to fretting debris. Fretting wear is a phenomenon that occurs between two surfaces having oscillatory relative motion of small amplitude. Fretting wear causes the removal of small particles from the contacting surfaces. These small particles subsequently oxidize and the oxidized debris accumulates at the interfaces of the connector assembly. Since the room temperature resistivity of tin is about 0.12 µΩ·m while the room temperature resistivity of tin oxide is about 1 µΩ·m, the result of fretting wear is a degrading of the connector assembly electrical properties.

Figure 4:
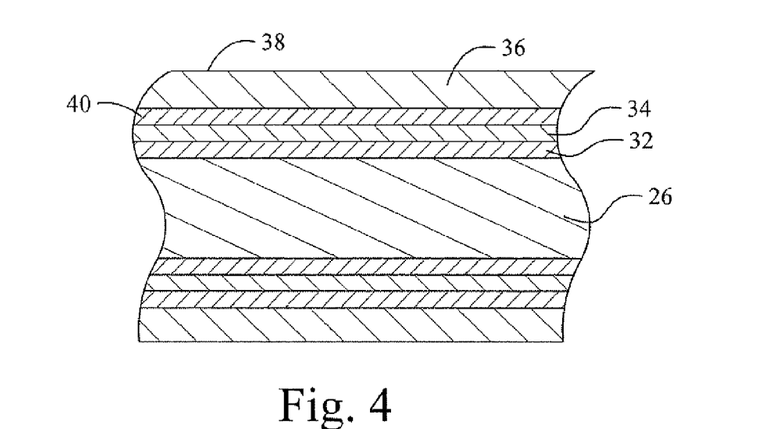
FIG. 4 is a cross-sectional view of a conductive strip coated in accordance with a second embodiment of the invention.

Fretting wear is reduced by forming the connector assembly in accordance with a second embodiment of the invention. With reference to FIG. 4, a substrate 26 is typically copper or a copper-base alloy, although other electrically conductive metals may be used. When one of those other electrically conductive metals is employed, a thin copper layer is deposited on the substrate as described above. The thin copper layer may also be deposited on a copper-base alloy substrate to provide a pure copper surface to facilitate deposition and adherence of subsequent layers.

Deposited on to the copper or copper-base alloy substrate or thin copper layer is a barrier layer 32. The barrier layer may be any metal that inhibits the diffusion of copper and the other constituents making up the substrate and is preferably a transition metal, such as nickel, cobalt, iron, manganese, chromium, molybdenum or their alloys. The barrier layer has a thickness of between 2 microinches and 80 microinches. If the barrier layer has a thickness of less than 2 microinches, it may not be effective to inhibit diffusion. If the barrier layer thickness exceeds 80 microinches, it may adversely affect the electrical and mechanical properties of the connector assembly. Preferably, the thickness is between 4 microinches and 40 microinches. More preferably, the thickness of the barrier layer is between 4 microinches and 20 microinches.

Deposited on the barrier layer 32 is a sacrificial layer 34. The sacrificial layer 34 is a metal that combines with both silver and tin to form alloys and intermetallic compounds. To reduce friction, the free tin thickness of outermost layer 36 is reduced. This thickness reduction may be accomplished by heating the assembly such that the sacrificial layer combines with the inner portion of the outermost layer to form relatively hard intermetallic compounds. A preferred material for the sacrificial layer is copper or a copper-base alloy having a thickness of between 2 microinches and 60 microinches. The thickness of the sacrificial layer is selected such that when the sacrificial layer is consumed, at least a thin, on the order of 2 microinches, layer of free tin preferably remains on the exterior surface 38 of the outermost layer 36. When the outermost layer is initially between 40 microinches and 80 microinches of tin, a copper sacrificial layer has a most preferred thickness of between 5 and 20 microinches.

Disposed between the sacrificial layer 34 and the outermost layer 36 is a low resistivity oxide metal layer 40. This low resistivity oxide metal oxide is a metal that forms an oxide at the anticipated operating temperature of the connector assembly that has a resistivity which is less than the resistivity of tin oxide. Silver or a silver base alloy is preferred for the low resistivity oxide metal layer 40. While tin oxide has a room temperature resistivity of about 1 µΩ·m, silver oxide has a room temperature resistivity of about 0.14 µΩ·m. By including silver oxide as a component of the fretting debris, the impact of fretting wear on the resistivity of the connector assembly is significantly reduced. The low resistivity oxide metal layer has a thickness of between 1 microinch and 120 microinches. If the thickness is less than 1 microinch, there is insufficient silver oxide to affect the connector assembly resistivity. If the thickness exceeds 120 microinches, cost becomes prohibitive. Preferably, the thickness of the low resistivity oxide metal layer is between 2 microinches and 40 microinches and most preferably, between 5 microinches and 20 microinches.

Figure 5:
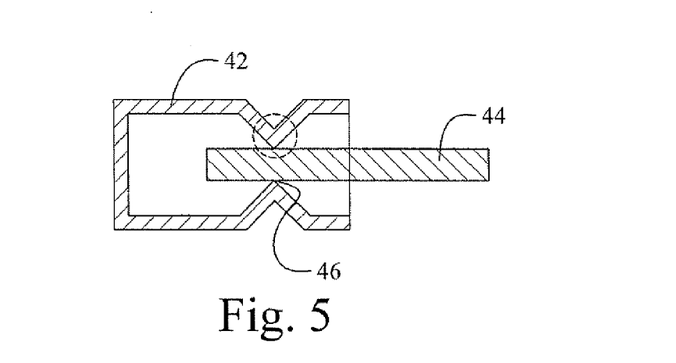
FIG. 5 is a cross-sectional view of the conductive strip of FIG. 4 subsequent to being formed into a connector assembly.

The conductive strip of FIG. 4 is formed into a connector assembly as shown in cross-sectional representation in FIG. 5. The connector assembly includes a socket 42 and probe 44. The socket is usually bent into a shape effective to make point contact with the probe with the shape also imparting an internal stress in the socket effective to apply a positive force to maintain electrical contact at the point 46.

Figure 6:
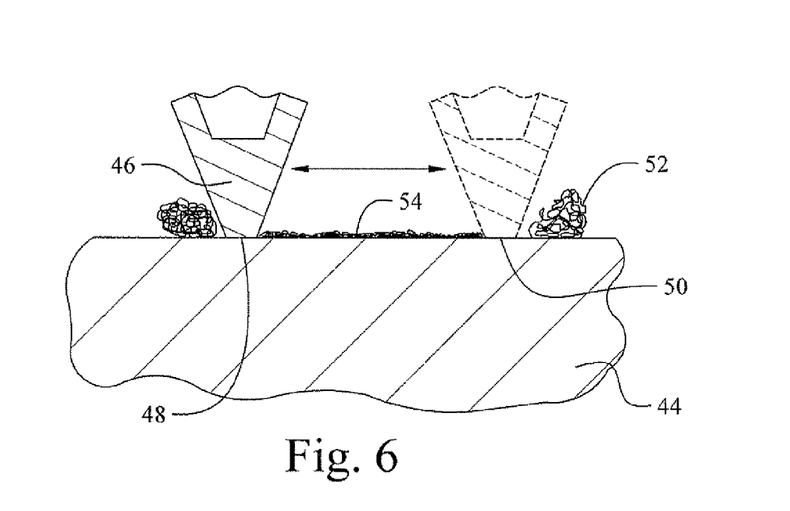
FIG. 6 is a magnified cross-sectional view of a portion of the connector assembly of FIG. 5 illustrating the effect of fretting debris.

FIG. 6 is a magnified view of the point contact identified by a broken circle in FIG. 5. Due to vibration, the point 46 oscillates between a first contact point 48 and a second contact point 50. This fretting generates fretting debris 52 in the form of metal oxides. A portion 54 of the fretting debris coats the oscillation track and impacts the flow of electric current between the point 46 and probe 44.

The low resistivity oxide metal layer is any metal that both forms an oxide with a resistivity less that of tin oxide (1 μΩ·m) or is a metal more noble than silver that has a low tendency to form oxides, such as gold, platinum and palladium. Table 1 identifies the oxides of many base metals and reports their suitability for use as the low resistivity oxide metal layer. In Table 1, "O" indicates suitability and "X" indicates not suitable. As alternatives to silver, indium, iron, niobium, rhenium, ruthenium, vanadium, gold, platinum, palladium and zinc, as well as mixtures of these four metals are suitable.

TABLE 1

|  | Base Metal | Oxide | Room Temperature Resistivity (Ω·m) | Suitability |
|---|---|---|---|---|
| Resistivity Acceptable | Cadmium | CdO | 3.90E−05 | X - Toxic |
|  | Indium | $In_2O_3$ | 1.00E−03 | O |
|  | Iron | $Fe_3O_4$ | 1.00E−04 | O |
|  | Niobium | $Nb_2O_3$ | 8.60E−04 | O |
|  | Rhenium | $ReO_3$ | 2.00E−05 | O |
|  | Ruthenium | $Ru_2O$ | 3.52E−07 | O |
|  | Silver | AgO | 0.14 | O |
|  | Uranium | $UO_2$ | 3.80E−02 | X - Toxic |
|  | Vanadium | $V_2O_3$ | 5.50E−05 | O |
|  | Zinc | ZnO | 1.50E−02 | O |
| Resistivity Not Acceptable | Bismuth | $Bi_2O_3$ | 1.00E+07 |  |
|  | Cobalt | CoO | 1.00E+06 |  |
|  | Copper | $Cu_2O$ | 2.00E+05 |  |
|  | Europium | EuO | 1.00E+06 |  |
|  | Manganese | MnO | 1.00E+06 |  |
|  | Nickel | NiO | 1.00E+11 |  |
|  | Silicon | $SiO_2$ | 1.00E+12 |  |
|  | Sodium | $Na_2O_2$ | 2.50E+02 |  |
|  | Tantalum | $Ta_2O_5$ | 1.00E+03 |  |

Figure 7:
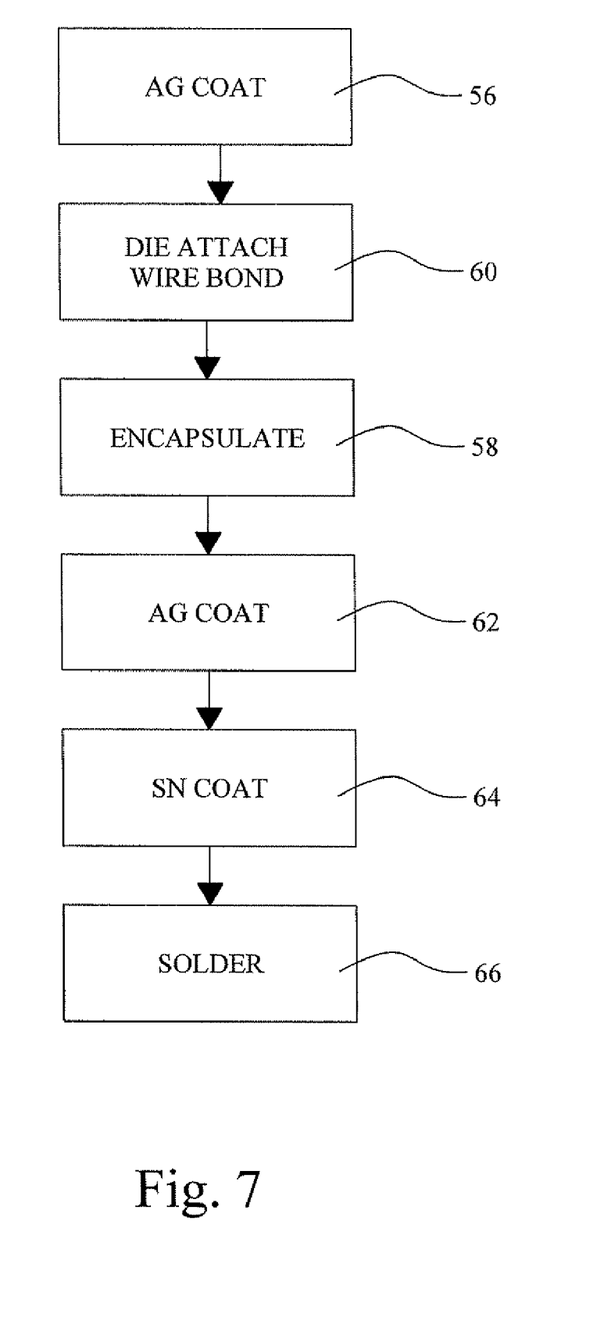
FIG. 7 is a flow chart representation of a process to manufacture the first embodiment of the invention.

FIG. 7 is a flow chart representation of a method for the production of the coated substrate illustrated in FIG. 3 for use in applications where tin whiskering is a concern and tin reflow is not an option to relieve internal stress. Such applications include leadframes, closely spaced terminal pins (such as found in a pin grid array electronic package) and closely spaced circuit traces on a printed circuit board or flexible circuit. Referring back to FIG. 7, the first three process steps are specific to a leadframe and in some embodiments terminal pins. The remaining three steps are generic to all the above product lines.

A leadframe is either stamped or chemically etched from a substrate, typically copper or a copper base alloy. The leadframe includes a centrally disposed die paddle and a plurality of leads extending outwardly from at least one, and typically all four, sides of the die paddle. The leadframe is then degreased and cleaned, such as by a commercial degreaser, for an alkaline electrocleaner such as Hubbard-Hall E-9354 electrocleaner (available commercially from Hubbard-Hall, Waterbury, Conn.). An alkaline mixture along with anodic/cathodic electrocleaning allows generated oxygen or hydrogen bubbles to remove most impurities residing on the substrate. Electrocleaning is typically performed at about 20° C. to 55° C. for about one minute with a current density range of about 10 to 50 asf (amps per square foot).

The die paddle and inner portions of the leads are then coated 56 with a metal that enhances solderability and wire bonding, such as silver to a thickness of from 3 microns to 6 microns. It is preferable that only the innermost portion of the leads, the part utilized for wire bonding or tape automated bonding (TAB) be silver coated. This is because during the subsequent encapsulation step 58, it is desired for the molding resin to directly contact the copper substrate, providing a single interface for adhesion failure and moisture egress. Less preferred is a two interface arrangement where the molding resin contacts the silver layer that contacts the copper substrate. The silver coating 56 may be by any suitable process, such as electrodeposition, electroless deposition, immersion coating, chemical vapor deposition or plasma deposition.

The IC device is then bonded to the die paddle by convention die attach methods 60 such as soldering with a low temperature solder, for example a gold/tin eutectic, or adhesive joining, such as with a metal filled epoxy. Wire bonding employs small diameter wires or thin strips of metal foil to electrically interconnect the IC device to the inner lead portions of the leadframe. Subsequent to die attach and wire bonding, the die paddle, IC device, wire bonds and inner lead portions of the leadframe are encapsulated in a thermosetting molding resin, such as an epoxy. The outer portions of the leads are then bent into a desired shape for bonding to a printed circuit board or other external circuit.

The outer lead portions are then coated 62 with a layer of silver or silver alloy, by any suitable process, such as electroplating, electroless plating, immersion plating, physical vapor deposition, chemical vapor deposition, plasma deposition or metal spraying. The silver is applied to a thickness of from 1 microinch to 120 microinches, with a thickness of from 2 microinches to 20 microinches being most preferred.

A preferred method of depositing the layer of silver is by electroplating from an aqueous solution containing 31-56 grams per liter silver cyanide, 50-78 g/l potassium cyanide, 15-90 g/l potassium carbonate and brighteners. Electroplating is at a temperature of between 20° and 28° C. at a current density of between 5 amps per square foot and 15 asf. Alternatively, the silver layer can be deposited using cyanide-free immersion plating such as MacDermid Sterling™ Silver (MacDermid Inc., Waterbury, Conn.).

A layer of tin is then coated 64 on the Ag coated outer leads to a thickness of from 0.006 microinch to 400 microinches and preferably to a thickness of from 20 microinches to 80 microinches. A preferred method of depositing the layer of tin is by electroplating from a solution containing methane sulfonic acid based tin plating solution such as Rohm and Haas Solderon™ ST200 (Rohm and Haas Company, Philadelphia, Pa.) or MacDermid StanTek™ AMAT for matte tin. MacDermid StanTek™ Stellite is useful for bright tin. Typical operating conditions for the above electrolytes are a temperature of 25° C.-35° C. and a current density of between 5 asf and 50 asf.

The tin coated exterior leads are then bonded 66 to a printed circuit board or other external circuit, such as by soldering using either a tin/lead alloy solder or appropriate leadfree solder. The solder and soldering process are selected to enable the solder to fuse to the layer of tin without the layer of tin melting. Melting of the layer of tin is to be avoided to prevent bridging of liquid solder between leads.

Figure 8:
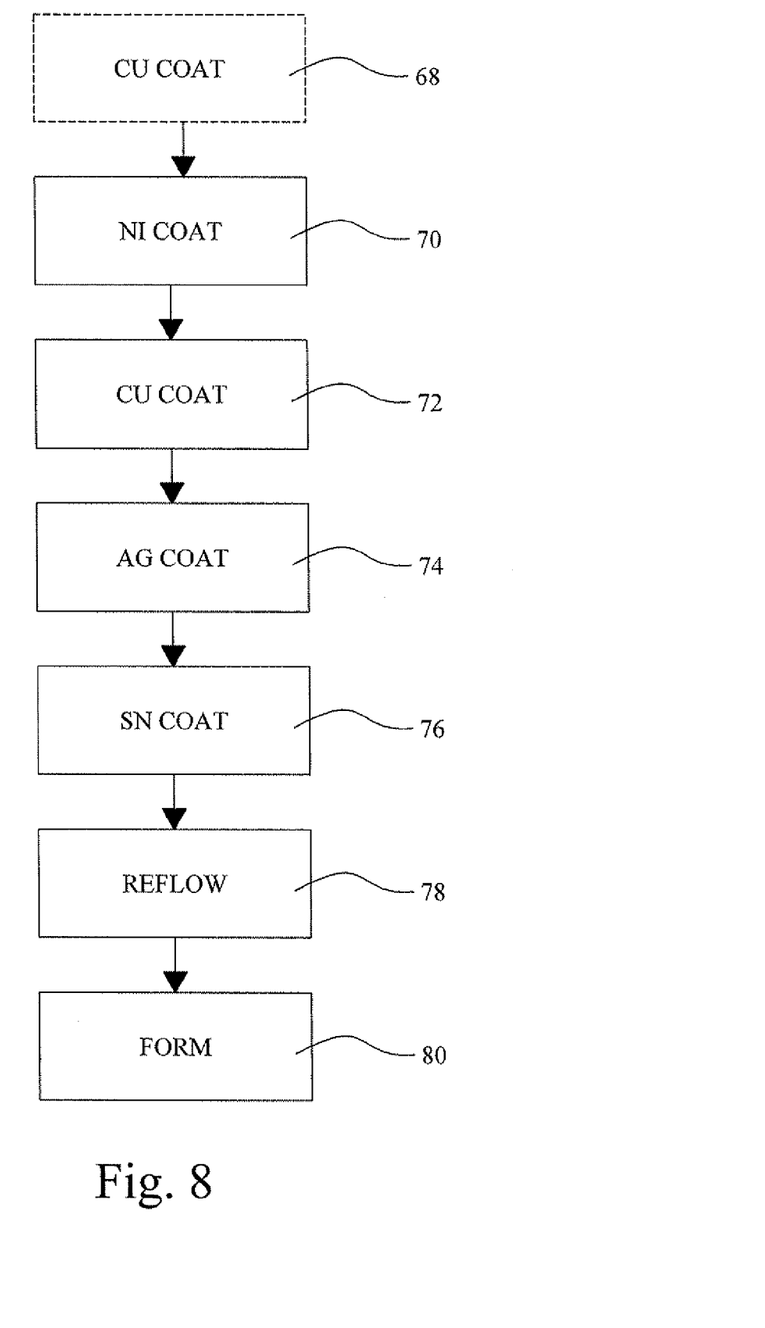
FIG. 8 is a flow chart representation of a process to manufacture the second embodiment of the invention.

FIG. 8 is a flow chart representation of a method for the production of the coated substrate illustrated in FIG. 4 for use in applications where the effect of the oxidized debris of fretting wear on electrical resistivity is a concern, such as in electrical connector assemblies. Referring back to FIG. 7, when the substrate is not copper, or where the substrate is a copper alloy having a high (for example greater than 2%, by weight) alloy content, it is desirable to deposit 68 a thin copper layer on the surfaces of the substrate prior to deposition of subsequent layers. The thin copper layer minimizes the effect of different metals on the deposition of subsequent layers leading to more consistent product performance for many different substrate materials.

The copper layer has a minimum thickness of 5 microinches and has a typical thickness of between 20 microinches and 40 microinches. While the copper layer and the subsequent layers described below may be deposited by any suitable method, a preferred method of depositing 68 the layer of copper is by electroplating from an aqueous solution containing from 20 g/l to 70 g/l of copper ions and from 50 g/l to 200 g/l of sulfuric acid. Operating conditions are a temperature of from 40° C. to 60° C. at a current density of from 20 asf to 100 asf.

A barrier layer is next deposited 70. Suitable barrier layers include nickel, cobalt, chromium, molybdenum, iron and manganese and their alloys or mixtures deposited to a thickness of from 2 microinches to 40 microinches and preferably to a thickness of from 4 microinches to 20 microinches. A preferred method of depositing 70 the layer of nickel is by electroplating from an aqueous solution nominally containing 300 g/l of nickel sulfamate, 6 g/l of nickel chloride and 30 g/l of boric acid. Operating conditions are a temperature of from 28° C. to 60° C., a pH of from 3.5 to 4.2 and a current density of from 2 asf to 30 asf.

A sacrificial layer, such as of copper, is next deposited 72 to a thickness effective to combine with a portion of the tin during a controlled thermal excursion to form copper/tin intermetallics such as $Cu_3Sn$, $Cu_6Sn_5$, and $(Cu\ alloy)_xSn_y$, while retaining a layer of essentially pure tin (referred to as free tin) on the surface. The layer of free tin should be on the order of 2 microinches to 120 microinches to provide a solderable, tarnish resistant, layer. The intermetallic layer is useful to reduce friction by reducing the thickness of soft free tin. Reduced friction leads to reduced insertion force required for the connector assembly.

After depositing 72 the sacrificial layer, a metal that forms a low resistivity oxide, such as silver, is deposited 74. The sacrificial layer is deposited to a thickness of from 1 microinch to 120 microinches and preferably to a thickness of from 5 microinches to 20 microinches. A preferred method of depositing the sacrificial layer of silver is by electroplating from an aqueous solution containing silver cyanide or by immersion plating from a cyanide-free solution as described above. In addition to silver, indium, iron, niobium, rhenium, ruthenium, vanadium, gold, platinum, palladium and zinc, as well as mixtures of these metals, may be employed as illustrated above in Table 1.

After depositing 74 the sacrificial layer, an outermost layer of a metal having a melting temperature less than the melting temperature of any one of the substrate, the barrier layer, the sacrificial layer and the low resistivity oxide metal layer, is deposited 76. Tin or tin-base alloys are preferred for the outermost layer. For most applications, lead is avoided for toxicity concerns; however, a tin-base alloy containing lead may be suitable for some applications. The outermost layer is deposited 76 by any of the methods described above or by tin deposition specific methods such as HALT (hot air level tin) process and mechanical wipe. The outermost layer can have a bright or matte finish, as desired. A matte finish may be produced by electroplating tin from a tin bath that is known in the art for preparing this type of finish. Suitable electrolytes include Solderon™ ST200 and StanTek™ AMAT as described above.

The tin is then reflowed 78, such as by heating to a temperature above the melting point of tin (232° C.) to reflow the tin. A preferred thermal profile is 300° C. for a few (1-10) seconds in air or in a protective atmosphere, such as nitrogen. The molten tin is then quenched to produce a lustrous appearance.

Either before or after reflow the coated substrate is formed 80 into a desired component, such as part of a connector assembly. The coated substrate may also be heated in air or nitrogen at a temperature less than the melting temperature of the tin to increase the amount of intermetallic and reduce the free tin to a desired thickness, typically from 2 microinches to 20 microinches. This heating may be at a temperature of from 150° C. to 200° C. for from 1 hour to 168 hours.

Figure 9A:
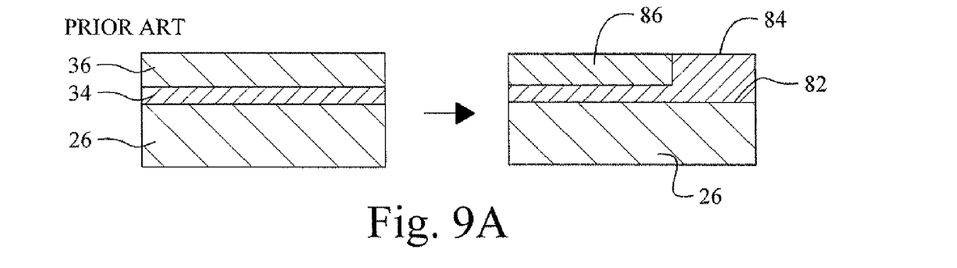
FIG. 9 illustrates the interdiffusion between layers in coated substrates with different layer combinations.

A mechanism for the improved coatings of the invention may be understood with reference to FIGS. 9a through 9D. FIG. 9A illustrates a tin coated substrate 26 as known form the prior art. The substrate 26 is coated with a sacrificial layer of copper 34 and an outermost tin layer 36. After exposure to elevated temperatures, such as 150° C. for one week, interdiffusion and combining occur between the sacrificial layer 34 and outermost layer 36 to form a $Cu_3Sn$ intermetallic layer 82 adjacent the substrate 26 that extends upwards to the surface 84 of the outermost layer. The outermost layer, after elevated temperature exposure is a mixture of the $Cu_3Sn$ intermetallic and the $Cu_6Sn_5$ intermetallic 86. These two copper base intermetallics are prone to oxidation leading to discoloration and an increase in resistivity.

Figure 9B:
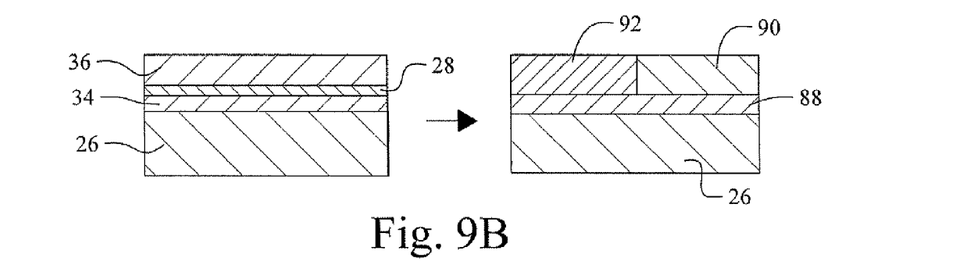

FIG. 9B illustrates that, in accordance with the invention, when the substrate 26 is coated with a sacrificial layer 34, silver layer 28 and outermost tin coating layer 36 and then heated to 150° C. for one week, the substrate 26 is coated with an intervening layer 88 that is a mixture of copper and tin while the outermost layer is a mixture of silver containing $Cu_3Sn$ intermetallic 90 and a silver-rich phase 92. By silver-rich, it is meant that the phase contains in excess of 50 atomic % silver. The $Cu_3SnAg_x$ intermetallic provides a hard surface to reduce insertion force and reduce fretting wear. The silver-rich phase provides tarnish resistance and reduces the increase in resistivity due to fretting wear debris corrosion.

Figure 9C:
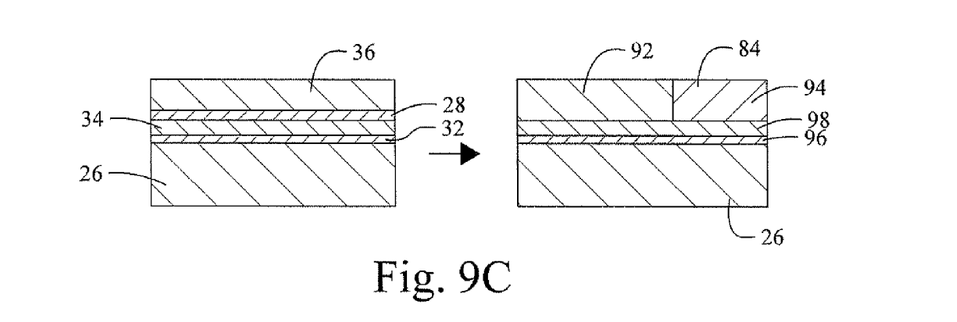

FIG. 9C illustrates that, in accordance with the invention, when the substrate 26 is coated with a barrier layer 32, sacrificial layer 34, silver layer 28 and outermost tin coating 36 and then heated to 150° C. for one week, the substrate 26 is then coated with intervening layer 96 that is a mixture of nickel, copper and tin. Adjacent the layer 96 is a second layer 98 that is a mixture of nickel, copper, silver and tin. The outermost layer is a mixture a first component which is $Cu_6Sn_5$ intermetallic and excess tin and a trace of silver and a second component which is the silver-rich phase 92.

Figure 10:
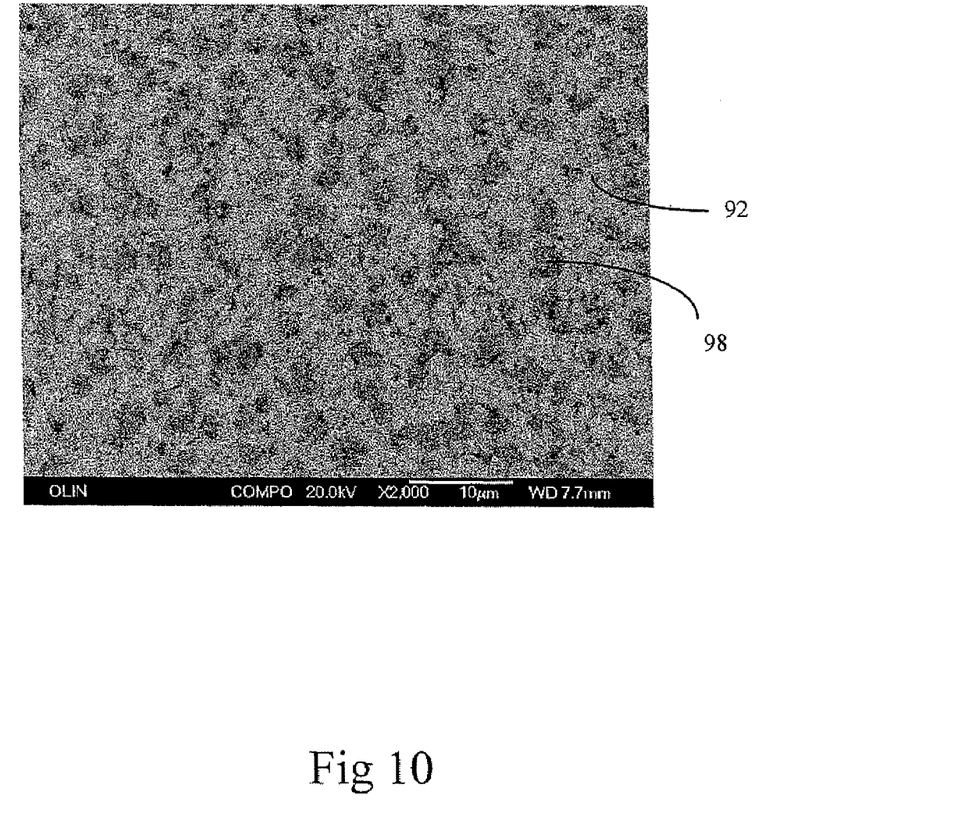
FIG. 10 is a photomicrograph of a surface of a coated substrate of the invention following heating to 150° C. for one week.
Figure 11:
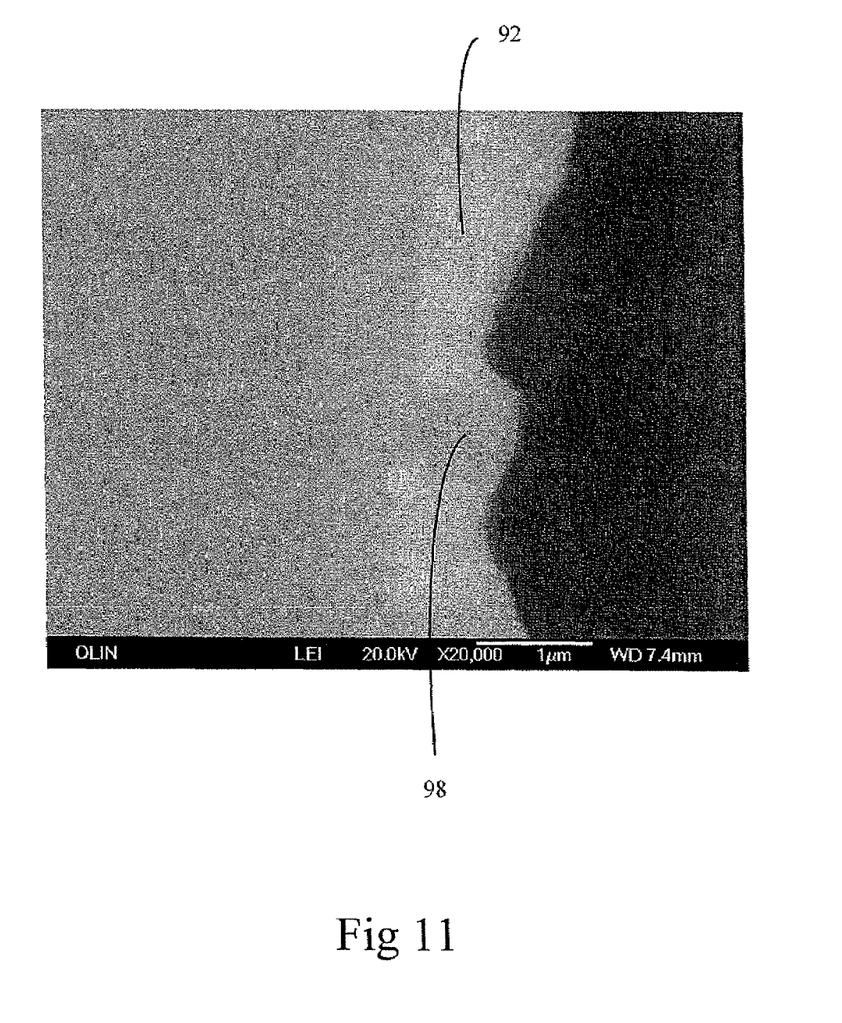
FIG. 11 is a photomicrograph of a cross-section of the coated substrate of FIG. 10.

FIG. 10 is a photomicrograph, at a magnification of 2000 times, of the outermost surface 84 of the coated substrate of FIG. 9C after heating to 150° C. for one week. The surface is a mixture of copper-silver-tin phase 98, which appears as dark regions in the photomicrograph, and silver-rich phase 92, which appears as light regions in the photomicrograph. FIG. 11 is a photomicrograph, at a magnification of 20,000 times, of the coated structure of FIGS. 9C and 10.

Figure 9D:
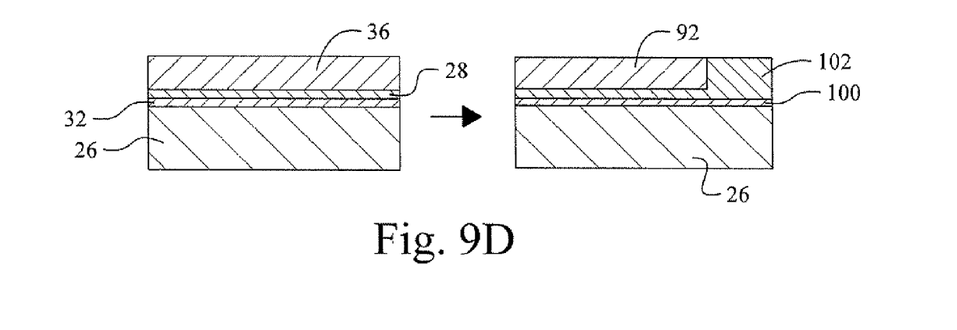

FIG. 9D illustrates that when the substrate 26 is coated with a barrier layer 32, silver layer 28 and outermost coating layer of tin 36 and then heated to 150° C. for one week, the substrate 26 is then coated with a first intervening layer 100 that is a mixture of nickel, copper and tin with a trace of silver. The first intervening layer 100 is coated with a second layer 102 that is a mixture of copper, nickel, tin and silver. This second layer 102 extends to the surface of the outermost layer which is predominantly the silver-rich phase 92.

The advantages of the coating systems of the invention will become apparent from the examples that follow. The following examples are intended to illustrate and not to limit the scope of the present invention.

deposits. The plating conditions were 30 asf for about 50 to 400 seconds at 25° C. to 40° C.

An accelerated tin whisker test was conducted on the samples by bending and restraining samples in a circular groove with a radius of 3". In this way a constant bending stress was applied to the tin coating to induce the formation of whiskers. The compressed (concave) sides of exemplary and comparative samples were periodically examined under an optical microscope at 500× to observe the formation of tin whiskers.

TABLE 2

| Sample | Tin Finish | Intervening Layers, Thickness in microinches | | | Tin thick. in μinches | Number of whiskers per mm$^2$ and length of longest whisker in microns | | | | | | | |
|---|---|---|---|---|---|---|---|---|---|---|---|---|---|
| | | Ni | Cu | Ag | | 10 days | | 60 days | | 120 days | | 180 days | |
| | | | | | | # | μm | # | μm | # | μm | # | μm |
| 1 | matte | -0- | 20-40 | -0- | 250-500 | 25 | 19 | 58 | 28 | 138 | 36 | 295 | 53 |
| 2 | matte | -0- | 20-40 | -0- | 75-130 | 33 | 28 | 298 | 175 | 310 | 87 | 496 | 169 |
| 3 | matte | -0- | 20-40 | 5-10 | 75-130 | -0- | -0- | -0- | -0- | -0- | -0- | -0- | -0- |
| 4 | matte | -0- | 20-40 | -0- | 40-80 | 108 | 36 | 389 | 45 | 361 | 130 | 512 | 45 |
| 5 | matte | -0- | 20-40 | 5-10 | 40-80 | -0- | -0- | -0- | -0- | -0- | -0- | 5 | 5 |
| 17 | matte | 5-20 | -0- | 5-10 | 40-80 | -0- | -0- | -0- | -0- | -0- | -0- | 2 | 4 |
| 19 | matte | 5-20 | 7-18 | 5-10 | 40-80 | -0- | -0- | -0- | -0- | -0- | -0- | -0- | -0- |
| 20 | bright | -0- | 20-40 | -0- | 40-80 | 8 | 7 | 33 | 7 | 30 | 9 | 231 | 28 |
| 21 | bright | -0- | 20-40 | 5-10 | 40-80 | -0- | -0- | -0- | -0- | -0- | -0- | -0- | -0- |

EXAMPLES

Example 1

Tin Whiskering

Coupons 2 inches×0.5 inch×0.010 inch thick were cut from a strip of copper alloy C194. Copper alloy C194 has a composition by weight of 2.1%/-2.6% iron, 0.05%-0.20% zinc, 0.015%-0.15% phosphorous and the balance is copper. The coupons were cleaned in a commercial alkaline cleaner at 50° C. using a cathodic current density of 15 asf (amps per square foot) for 1 minute.

Referring to Table 2, when a nickel layer was deposited, deposition was by electroplating. The Ni plating solution was an aqueous solution containing from about 60 to 75 g/l (grams per liter) Ni as Ni sulfamate, about 6 to 8 g/l NiCl$_2$, and about 38 to 53 g/l boric acid at 53° C. with a pH between about 3.5 and 4.2. The Ni plating conditions were 30 asf for about 60 seconds.

When a copper layer was deposited, deposition was by electroplating from an aqueous solution containing about 20 to 70 g/l Cu and about 50 to 200 g/l H$_2$SO$_4$ at 40-60° C. using a current density of 40 asf for about 40 sec.

When a silver layer was deposited, deposition was made in an aqueous solution containing 31-56 g/l silver cyanide, 50-78 g/l potassium cyanide, 15-90 g/l potassium carbonate and brighteners. Operating conditions were a temperature of from 20° C. to 28° C. and a current density of from 5 asf to 15 asf.

Tin was deposited by electroplating from the MacDermid StanTek™ AMAT solution for matte tin deposits and from the MacDermid StanTek™ Stellite 100 solution for bright tin As shown from Table 2, the inclusion of a silver layer directly contacting the tin coating layer substantially eliminated the formation of tin whiskers for both a matte tin outermost coating and a bright tin outermost coating. For matte tin, compare Sample 2 to Sample 3 and Sample 4 to Sample 5. For comparison, Sample 1 is a commercial thick tin product. For a bright tin outermost coating, compare Sample 20 to Sample 21.

Example 2

Fretting Wear Impact on Contact Resistance

Coupons having the dimensions 6 inches by 1.25 inches by 0.005 inch were formed from copper alloys C194 and C7025, has a composition, by weight, of 2.2%-4.2% nickel, 0.25%-1.2% silicon, 0.05%-0.3% Mg and the balance is copper.

The copper alloy coupons were coated with intervening layers and matte tin as in Example 1 except that the silver layer was deposited by the immersion method using MacDermid Sterling™ silver solution and the tin was deposited from a sulfate solution containing 20 g/l to 80 g/l of tin ions as SnSO$_4$ 50 g/l to 200 g/l sulfuric acid, and organic additives.

The impact of fretting wear on contact resistance was determined by moving a ¼" diameter bump at 5 Hz up to 20,000 cycles with a cycle length of 20 μm across a contact surface to be tested. A normal force of 100 g was applied to the bump, and contact resistance data was collected while the bump was in motion. The values reported are the number of cycles required to achieve a specified contact resistance. A higher number of cycles indicates a better resistance to fretting.

TABLE 3

| Sample | Substrate | Intervening Layers | Surface Layer | Surface Layer Thickness (μinch) | Cycles to 10 mΩ Contact Resistance | Cycles to 10 Ω Contact Resistance |
|---|---|---|---|---|---|---|
| 1 | C194 | Ni/Cu | Matte Tin | 20 | 61 | 3269 |
| 2 | C194 | Ni/Cu/ 5 μinch Ag | Matte Tin | 20 | 79 | 4400 |
| 3 | C194 | None | Matte Tin | 40 | 116 | 2269 |
| 4 | C194 | 5 μinch Ag | Matte Tin | 42 | 490 | >5000* |
| 5 | Wrought Tin | None | None | N/A | 253 | 6530 |
| 6 | Wrought Ag | None | None | N/A | >20,000 | >20,000 |

*Testing terminated after 5000 cycles

Comparing Sample 2 of the invention to Sample 1 demonstrates that the addition of a 5 μin silver layer was effective to reduce the fretting wear induced resistance of the substrate by about a 30% increase in the number of cycles needed to reach 10 mΩ contact resistance and about a 35% increase in the number of cycles needed to reach 10 Ω contact resistance.

Comparing Sample 4 of the invention to Sample 3 demonstrates that the addition of a 5 μin silver layer was effective to reduce the fretting wear induced resistance of the substrate by about a 322% increase in the number of cycles needed to reach 10 mΩ contact resistance and in excess of a 120% increase in the number of cycles needed to reach 10 Ω contact resistance.

Monolithic wrought Ag (Sample 6) had better performance than any of the samples having a coated copper substrate, but is not practical to form an electrical connector due to cost and tarnish. Monolithic wrought Sn (Sample 5) had a reasonably good fretting-resistant probably due to the abundance of free Sn or increased hardness resulting for rolling, but is not practical as a connector due to a lack of strength.

Example 3

Coefficient of Friction

Copper alloy C194 coupons having the dimensions 6 inch× 1.25 inch×0.005 inch were coated with intervening layers and matte tin as in the preceding examples. A reflowed tin surface was obtained by heating a sample to 350° C. in air and quenching in water.

The coefficient of friction was measure as the ratio of the resistive force relative to the normal force (R/N) when a ¼ inch diameter bump slid at 3 mm/sec for 10 cycles across a tin coated flat surface. The normal force was loaded as dead weight and no lubricant was applied between the tin coated surface and the bump. The resistive force was measured as the bump was slid against the flat surface of the sample. The value reported was the average of all 10 cycles. A lower R/N indicates less friction. The results are reported in Table 4.

TABLE 4

| | Intervening Layers - Thickness in μinch | | | Tin Thickness | R/N 0-60 mm | |
|---|---|---|---|---|---|---|
| Sample | Cu | Ag | Tin Type | μinch | 100 g | 250 g |
| 1 | 20-40 | -0- | Matte | 40-80 | 0.55 | 0.55 |
| 2 | 20-40 | 2-5 | Matte | 40-80 | 0.58 | 0.53 |

TABLE 4-continued

| | Intervening Layers - Thickness in μinch | | | Tin Thickness | R/N 0-60 mm | |
|---|---|---|---|---|---|---|
| Sample | Cu | Ag | Tin Type | μinch | 100 g | 250 g |
| 3 | 20-40 | 5-10 | Matte | 40-80 | 0.48 | 0.45 |
| 4 | 20-40 | 10-20 | Matte | 40-80 | 0.47 | 0.46 |
| 5 | -0- | -0- | Reflow | 40 | 0.48 | 0.47 |
| 6 | -0- | 5 | Reflow | 40 | 0.30 | 0.22 |

As R/N decreases, the insertion force required to insert a probe into a socket decreases. Comparing Sample 3 to Sample 1 and 2 shows that an addition of 5 microns of silver provides about a 14% reduction in R/N for a matte tine outer layer. Comparing Sample 3 to Sample 4 shows that increasing the silver thickness has no appreciable benefit and leads to higher costs.

Comparing Sample 5 and 6 shows that a more pronounced benefit, about 45% decrease in R/N, is achieved with reflowed tin as an outer coating layer.

Example 4

Interdiffusion Between Layers

Tables 5 thought 8 report the measured compositions of the structures illustrated in FIGS. 9A thought 9D to demonstrate the formation of silver-rich phase on the outermost surface of substrates coated in accordance with the invention. The thicknesses, in microinches, before heating to 150° C. for one week, were measured by XRF (x-ray fluorescence). The composition and atomic percents after hearing were determined by EDX (energy-dispersed x-rays).

TABLE 5

(FIG. 9A)

| Ref. No. from FIG. 9A | Composition | Thickness (μinches) | Ref. No. from FIG. 9A | Composition | Atomic Percent |
|---|---|---|---|---|---|
| 26 | C194 | N.A. | 26 | C194 | N.A. |
| 34 | Copper | 20-40 | 82 | Copper Tin | 75% 25% |
| 36 | Tin | 40-80 | 86 | Copper Tin | 56% 44% |

TABLE 6

(FIG. 9B)

| Ref. No. from FIG. 9B | Composition | Thickness (μinches) | Ref. No. from FIG. 9B | Composition | Atomic Percent |
|---|---|---|---|---|---|
| 26 | C194 | N.A. | 26 | C194 | N.A. |
| 34 | Copper | 20-40 | 88 | Copper | 79% |
|  |  |  |  | Tin | 21% |
| 28 | Silver | 5-10 | 90 | Copper | 74% |
|  |  |  |  | Tin | 23% |
|  |  |  |  | Silver | 3% |
| 36 | Tin | 40-89 | 92 | Silver | 56% |
|  |  |  |  | Tin | 25% |
|  |  |  |  | Copper | 19% |

TABLE 7

(FIG. 9C)

| Ref. No. from FIG. 9C | Composition | Thickness (μinches) | Ref. No. from FIG. 9C | Composition | Atomic Percent |
|---|---|---|---|---|---|
| 26 | C194 | N.A. | 26 | C194 | N.A. |
| 32 | Nickel | 5-20 | 96 | Copper | 42% |
|  |  |  |  | Nickel | 32% |
|  |  |  |  | Tin | 26% |
| 34 | Copper | 7-18 | 98 | Copper | 50% |
|  |  |  |  | Tin | 41% |
|  |  |  |  | Nickel | 7% |
|  |  |  |  | Silver | 2% |
| 28 | Silver | 5-10 | 94 | Tin | 77% |
|  |  |  |  | Copper | 17% |
|  |  |  |  | Silver | 6% |
| 36 | Tin | 40-80 | 92 | Silver | 56% |
|  |  |  |  | Tin | 31% |
|  |  |  |  | Copper | 13% |

TABLE 8

(FIG. 9D)

| Ref. No. from FIG. 9D | Composition | Thickness (μinches) | Ref. No. from FIG. 9D | Composition | Atomic Percent |
|---|---|---|---|---|---|
| 26 | C194 | N.A. | 26 | C194 | N.A. |
| 32 | Nickel | 5-20 | 100 | Tin | 41% |
|  |  |  |  | Nickel | 34% |
|  |  |  |  | Copper | 24% |
|  |  |  |  | Silver | 1% |
| 28 | Silver | 5-10 | 102 | Tin | 35% |
|  |  |  |  | Silver | 27% |
|  |  |  |  | Copper | 23% |
|  |  |  |  | Nickel | 15% |
| 36 | Tin | 40-80 | 92 | Silver | 64% |
|  |  |  |  | Tin | 26% |
|  |  |  |  | Copper | 10% |

It is noted that EDX analysis results may vary by a few percents due to x-ray beam spread and depth of penetration. However, for comparison purpose, the above results are useful to differentiate among samples.

Although the invention has been shown and described with respect to illustrative embodiments thereof, it should be appreciated that the forgoing and various other changes, omissions and additions in the form and detail thereof may be made without departing from the spirit and scope of the invention as delineated in the claims. All patents and patent applications mentioned are herein incorporated by reference in their entirety.

What is claimed is:

1. An electrically conductive material coated with a plurality of layers, comprising:
    an electrically conductive substrate;
    a barrier layer deposited on said substrate effective to inhibit diffusion of constituents in said substrate to said plurality of layers;
    a sacrificial layer deposited on said barrier layer effective to form intermetallic compounds with tin;
    a low resistivity oxide metal layer deposited on said sacrificial layer; and
    an outermost layer of tin or a tin-base alloy directly deposited on said low resistivity oxide metal layer, wherein the low resistivity oxide metal layer comprises a silver or silver-base alloy layer deposited on said sacrificial layer, and wherein a layer of copper is disposed between said sacrificial layer and said silver or silver-base alloy coating.

2. An electrical connector assembly including a socket and a probe, with at least one of said socket or probe comprising:
    an electrically conductive substrate;
    a barrier layer deposited on said substrate effective to inhibit diffusion of constituents in said substrate to said plurality of layers;
    a sacrificial layer deposited on said barrier layer effective to form intermetallic compounds with tin;
    a low resistivity oxide metal layer deposited on said sacrificial layer; and
    an outermost layer of tin or a tin-base alloy directly deposited on said low resistivity oxide metal layer, wherein the low resistivity oxide metal layer comprises a silver or silver-base alloy layer deposited on said sacrificial layer, and wherein a layer of copper is disposed between said sacrificial layer and said silver or silver-base alloy coating.

* * * * *